(12) United States Patent
Sander et al.

(10) Patent No.: US 7,116,583 B2
(45) Date of Patent: Oct. 3, 2006

(54) ELECTRICALLY PROGRAMMABLE MEMORY CELL AND METHODS FOR PROGRAMMING AND READING FROM SUCH A MEMORY CELL

(75) Inventors: Rainhald Sander, Munich (DE); Andreas Meiser, Munich (DE)

(73) Assignee: Infineon Technoloiges AG, Munich (DE)

( * ) Notice: Subject to any disclaimer, the term of this patent is extended or adjusted under 35 U.S.C. 154(b) by 0 days.

(21) Appl. No.: 11/104,686

(22) Filed: Apr. 13, 2005

(65) Prior Publication Data

US 2005/0243594 A1    Nov. 3, 2005

(30) Foreign Application Priority Data

Apr. 13, 2004    (DE) .................... 10 2004 017 768

(51) Int. Cl.
*G11C 11/34* (2006.01)
(52) U.S. Cl. .................... 365/185.28; 365/185.05; 257/219
(58) Field of Classification Search ........... 365/185.28, 365/185.05; 257/219
See application file for complete search history.

(56) References Cited

U.S. PATENT DOCUMENTS

| 5,278,428 A | * | 1/1994 | Yamada et al. ............... 257/66 |
| 5,621,684 A | * | 4/1997 | Jung ...................... 365/185.17 |
| 6,770,535 B1 | * | 8/2004 | Yamada et al. ............. 438/270 |
| 6,906,376 B1 | * | 6/2005 | Hsu et al. .................... 257/315 |
| 6,940,189 B1 | * | 9/2005 | Gizara ........................ 307/151 |
| 2003/0142549 A1 | | 7/2003 | Rowlandson et al. |
| 2004/0224476 A1 | * | 11/2004 | Yamada et al. ............. 438/400 |

OTHER PUBLICATIONS

Microchip Technology Inc., "Everything a System Engineer Needs to Know about Serial EEPROM Endurance," Microchip, AN537, pp. 8-15-8-16, (1992).

* cited by examiner

*Primary Examiner*—Michael Tran
(74) *Attorney, Agent, or Firm*—Dicke, Billig & Czaja, PLLC

(57) ABSTRACT

The invention relates to an electrically programmable memory cell comprising a memory transistor having a source and a drain zone and also a storage electrode and a control electrode, and a selection transistor having a source and a drain zone and also a control electrode, the drain zones of the storage and selection transistors being electrically conductively connected to one another. In this case, the drain zone of the selection transistor has a connection zone and an intermediate zone doped more weakly than the connection zone, the intermediate zone being arranged between the connection zone and a channel zone of the selection transistor and serving, during the programming operation, for taking up a programming voltage and thus for protecting a control electrode insulation layer of the selection transistor.

20 Claims, 5 Drawing Sheets a)

b)

US 7,116,583 B2

ELECTRICALLY PROGRAMMABLE MEMORY CELL AND METHODS FOR PROGRAMMING AND READING FROM SUCH A MEMORY CELL

CROSS-REFERENCE TO RELATED APPLICATIONS

This Utility Patent Application claims priority to German Patent Application No. DE 10 2004 017 768.6, filed on Apr. 13, 2004, which is incorporated herein by reference.

BACKGROUND

The present invention relates to an electrically programmable memory cell and to a method for programming and a method for reading from such a memory cell.

Memory cells of this type, which are also referred to as EEPROM memory cells (EEPROM=Electrically Erasable Programmable Read Only Memory), are sufficiently known.

The basic function of such an EEPROM memory cell is described for example in "Everything a System Engineer Needs to Know About Serial EEPROM Endurance", AN537, Microchip Technology Inc., 1992, pages 8–15 and 8–16.

FIG. 1 illustrates the fundamental construction of such a memory cell, with a memory transistor Ts' and a selection transistor Ta', at the semiconductor level (FIG. 1a) and in the equivalent circuit diagram (FIG. 1b). The basic principle of such a memory cell is based on the alteration of the threshold voltage of the memory transistor Ts' by electrical charge being stored on a storage electrode 41' of the memory transistor, said storage electrode being arranged in floating fashion. Depending on the memory state/programming state, when a read voltage is applied to a control electrode 44', a conducting channel forms in a channel zone of the memory transistor between a drain zone 30' and a source zone 20'. Said memory state can be read out by applying a voltage between the drain zone 30' and the source zone 20' and detecting the presence of a current flow between these connections.

In order to be able to read out the memory state of just one specific memory cell in a memory matrix having a multiplicity of identical memory cells, each memory cell has a selection transistor Ta'. The drain-source path of each memory cell is connected in series with the drain-source path of the memory transistor Ts', and the gate electrode Ga' of which is usually connected to a word line of the memory matrix, as will be explained below. At the semiconductor level, the drain zone of the memory transistor and the source zone of the selection transistor are usually formed jointly by the semiconductor zone 30', which is arranged at a distance from the source zone 20' of the memory transistor Ts' and at a distance from the drain zone 60' of the selection transistor Ta'. These drain and source zones 20', 30', 60' are arranged jointly in a complementarily doped semiconductor layer 10', which forms the body zone of the memory transistor Ts' and of the selection transistor Ta'.

The programming of the memory transistor Ts' is based on the tunnel effect. For this purpose, the insulation layer between the storage electrode 41' and the semiconductor layer is formed in sections as tunnel insulation layer 45', which, upon application of a sufficiently large voltage, enables a "tunneling" of charge carriers from the semiconductor body to the storage electrode 41'. In the case of the component in accordance with FIG. 1, said tunnel insulation layer 45' is formed between the drain zone 30' and that section of the storage electrode 41', which lies above said drain zone 30'. This memory cell is programmed by application of a positive programming voltage between the drain zone 30' and the control electrode Gs' of the memory transistor. Customary programming voltages are in the region of 20 V. When such a programming voltage is applied, electrons tunnel from the drain zone 30' to the storage electrode 41'. The storage electrode 41' is thereby charged negatively, as a result of which the threshold voltage of the memory transistor shifts toward higher values. In order to "erase" the memory cell, the programming voltage with an opposite sign is applied between drain 30' and control gate Gs' in order to discharge the storage electrode 41'. In order to read from the memory cell, a read voltage is applied between the control gate Gs' and the source connection Ss', said read voltage being chosen such that the memory transistor turns off in the programmed state when the read voltage is present and turns on in the erased state when the read voltage is present.

In the case of the memory cell explained, the selection transistor Ta' is required in order to apply the programming voltage required for programming the memory cell to the drain zone 30' of the memory transistor Ts' during the programming operation. Said programming voltage cannot be applied directly between drain 30' and gate Gs' of the memory transistor Ts', but rather is applied between the drain connection 60', Da' of the selection transistor Ta' and the gate Gs', 44' of the memory transistor Ts', the selection transistor Ta' being turned on by application of a drive voltage corresponding approximately to the programming voltage. Driving of the selection transistor Ta' with a drive voltage of the order of magnitude of the programming voltage ensures that the selection transistor Ta' is turned on throughout the programming operation.

The construction of a memory matrix has a plurality of such memory cells is explained below with reference to FIG. 2. FIG. 2 illustrates a memory matrix having only four memory cells Z11', Z12', Z21', Z22', of which two are in each case connected to a common word line WL1', WL2' and two are in each case connected to a common bit line pair BL1A', BL1B' and BL2A', BL2B'. The memory cells have in each case a memory transistor T11s', T112s', T21s', T22s' and in each case a selection transistor T11a', T12a', T21a', T22a'. The gate connections of the selection transistors T11a'–T22a' of a row of the memory matrix are in each case connected to a common word line WL1', WL2', the drain connections of the selection transistors T11a'–T22a' of a column of the memory matrix are in each case connected to a first bit line BL1A', BL2A' of the bit line pair and the source connections of the memory transistors T11s'–T22s' of a column of the memory matrix are in each case connected to a second bit line BL1B', BL2B' of the bit line pair. Moreover, the control electrodes of the memory transistors T11s'–T22s' of a row of the memory matrix are in each case connected to a programming and read line PL1', PL2'.

The programming and read-out operation for a cell of this memory matrix is explained below on the basis of the memory cell Z11', the selection transistor of which is connected to the word line WL1' and the memory transistor T11s' of which and which are assigned the bit line pair BL1A', BL1B'. The drain connection of the selection transistor T11a' of this cell Z11' is connected to the first bit line BL1A' and the source connection of the memory transistor T11s' is connected to the second bit line BL1B'. For programming the memory cell, a programming voltage is applied between the programming and read line PL1' and the first bit line BL1A'. The word line WL1' is likewise connected to the programming voltage. In order to prevent programming of the memory cell Z12' connected to the same programming and read line PL1', the first bit line BL2A' of this column of the memory matrix is biased such that approximately half of the programming voltage present at the memory transistor T11s' of the first memory cell Z11' is then present at the memory transistor T12s' of said cell. The further word line of the memory matrix WL2' is connected to a potential at which the selection transistors connected to this word line turn off, in order to prevent programming of the memory cell Z21' connected to the same bit line as the first memory cell Z11'.

In order to read out the memory state of a specific memory cell, for example the memory cell Z11', suitable read potentials are applied to the word line WL1' and the programming and read line PL1' of said cell. Moreover, a voltage is applied between the first bit line BL1A' and the second bit line BL1B' by connecting the first bit line BL1A' to a positive potential, for example, and the second bit line BL1B', via a further read transistor T1', to reference potential GND, for example. Not specifically illustrated in FIG. 2 is a detector circuit that identifies changes in the potential of the first bit line BL1A'. Such a change occurs depending on the memory state of the memory transistor T11s', that is to say depending on whether the memory transistor T11s' turns on or turns off when the read voltage is applied.

In the case of the memory cell explained previously, a control voltage corresponding to the programming voltage of the memory transistor is applied to the selection transistor Ta' during the programming operation. The gate insulation layer 70' of said selection transistor Ta' must be suitably dimensioned for this in order to withstand this voltage which is very high in comparison with the customary drive voltage of the selection transistor. The dielectric strength of this selection transistor lies above the dielectric strength of the gate insulation layers of components which are fabricated for example in a BCD technology (BCD technology=bipolar-CMOS-DMOS technology). Although the fundamental structure of an EEPROM memory cell could also be realized in BCD technology, the problem exists in this case, however, that additional complicated method steps would be required in order to fabricate a high-voltage-proof gate insulation layer of the selection transistor that withstands the programming voltage.

SUMMARY

One embodiment of the present invention provides an electrically programmable memory cell with a memory transistor and a selection transistor. With the programmable memory cell, it is possible to dispense with the realization of a high-voltage-proof insulation layer of the selection transistor.

One electrically programmable memory cell according to one embodiment of the invention has a memory transistor and a selection transistor. The memory transistor has a first and second semiconductor zone of a first conduction type, a first body zone, which has a channel zone arranged between the first and second semiconductor zones, a storage electrode, which is isolated from the first and second semiconductor zones and the body zone by a first insulation layer and which is formed at least in sections as tunnel insulation layer, and a first control electrode, which is arranged in a manner electrically insulated from the storage electrode. The selection transistor has a third and fourth semiconductor zone of the first conduction type, a second body zone of a second conduction type, which has a channel zone arranged between the third and fourth semiconductor zones, and a second control electrode, which is isolated from the third and fourth semiconductor zones and the body zone by a second insulation layer. In the case of the memory cell in accordance with one embodiment, the second semiconductor zone of the memory transistor and the third semiconductor zone of the selection transistor are electrically conductively connected to one another. Moreover, the third semiconductor zone of the selection transistor has a connection zone and an intermediate zone doped more weakly than the connection zone, the intermediate zone being arranged between the connection zone and the channel zone. In addition, the second body zone is connected to a terminal for a reference potential.

In the case of this memory cell according to one embodiment, the first semiconductor zone and the first body zone of the memory transistor are short-circuited, and the first insulation layer of the memory transistor is formed over the whole area as tunnel insulation layer. The whole-area formation of this first insulation layer as tunnel insulation layer reduces the fabrication costs of the component.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1a illustrates an electrically programmable memory cell according to the prior art at the semiconductor level.

FIG. 1b illustrates an equivalent circuit diagram of FIG. 1a.

DETAILED DESCRIPTION

Figure 1:
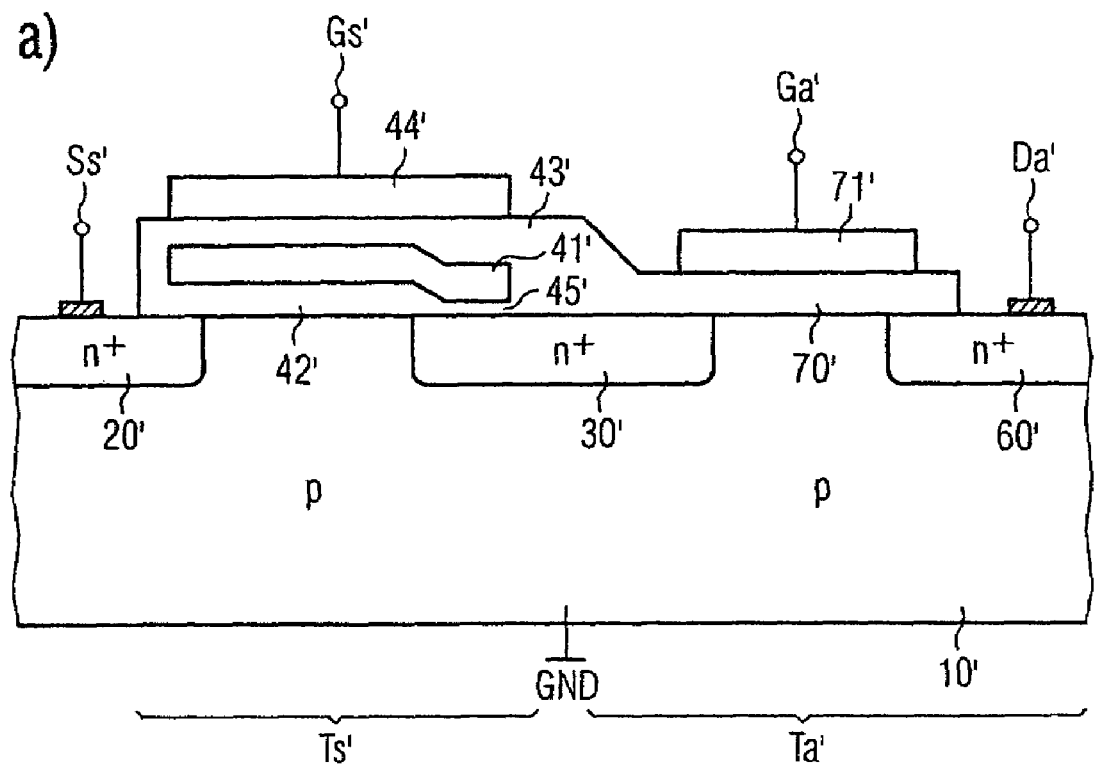
Figure 1:
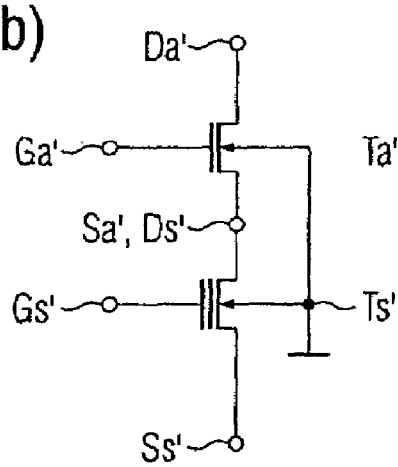
Figure 2:
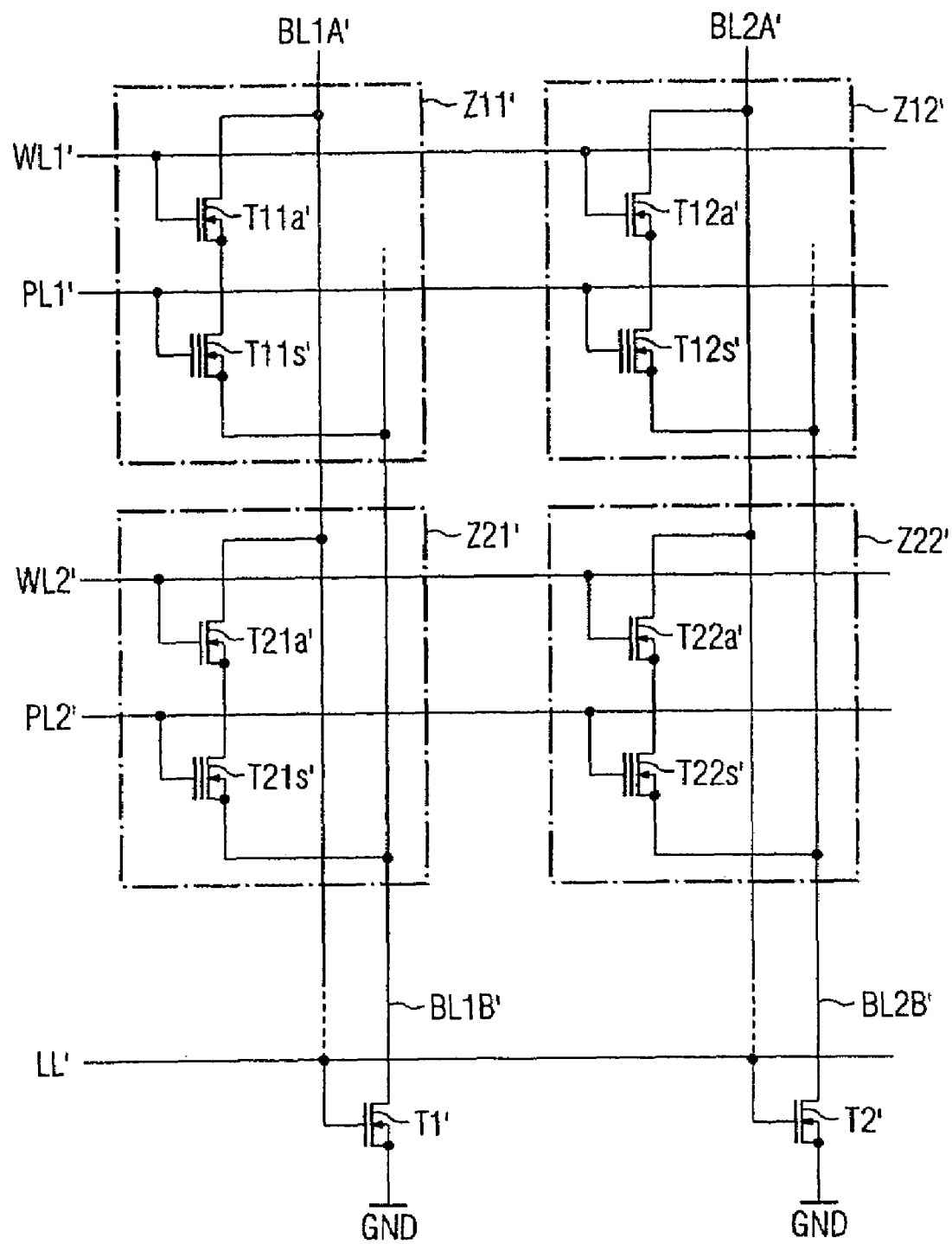
FIG. 2 illustrates a memory matrix with four electrically erasable memory cells according to the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

For programming a memory cell according to one embodiment of the invention, a programming voltage is applied between the first control electrode of the memory transistor and the first semiconductor zone, which forms the source zone of the memory transistor. In the case of a short circuit between the first semiconductor zone and the first body zone, said programming voltage, or a high potential resulting therefrom, may also be present at the connection zone of the third semiconductor zone of the selection transistor via the second semiconductor zone. In this case, the more weakly doped intermediate zone of said third semiconductor zone has the effect that said high potential drops in the direction of the channel zone in the semiconductor material, so that the second insulation layer between the control electrode of the selection transistor and the semiconductor layer is not subjected to a high voltage loading even during the programming operation.

In the case of the memory cell according to one embodiment of the invention, the second insulation layer may thus be dimensioned in accordance with the insulation layer in the case of logic components or low-voltage components.

In one embodiment, the thickness of this insulation layer is between 15 nm and 25 nm when using silicon oxide as the insulation layer. It goes without saying that, besides silicon oxide, any other suitable insulation materials may be used for the insulation layer, for example other semiconductor oxides when using a different semiconductor material than silicon.

In one case, the thickness of the first insulation layer formed as tunnel insulation layer lies in the range of between 10 nm and 20 nm.

In one embodiment, the memory transistor and the selection transistor of the memory cell are integrated in a common semiconductor body, the first body zone of the memory transistor being isolated from the second body zone of the selection transistor by an insulation zone of the first conduction type.

In one embodiment, the dimension of the intermediate zone proceeding from the connection zone in the direction of the channel zone is between 2 µm and 3 µm. In a direction perpendicular to this direction extending from the connection zone to the channel zone, the dimension of the intermediate zone is between 0.3 µm and 1 µm.

Figure 3:
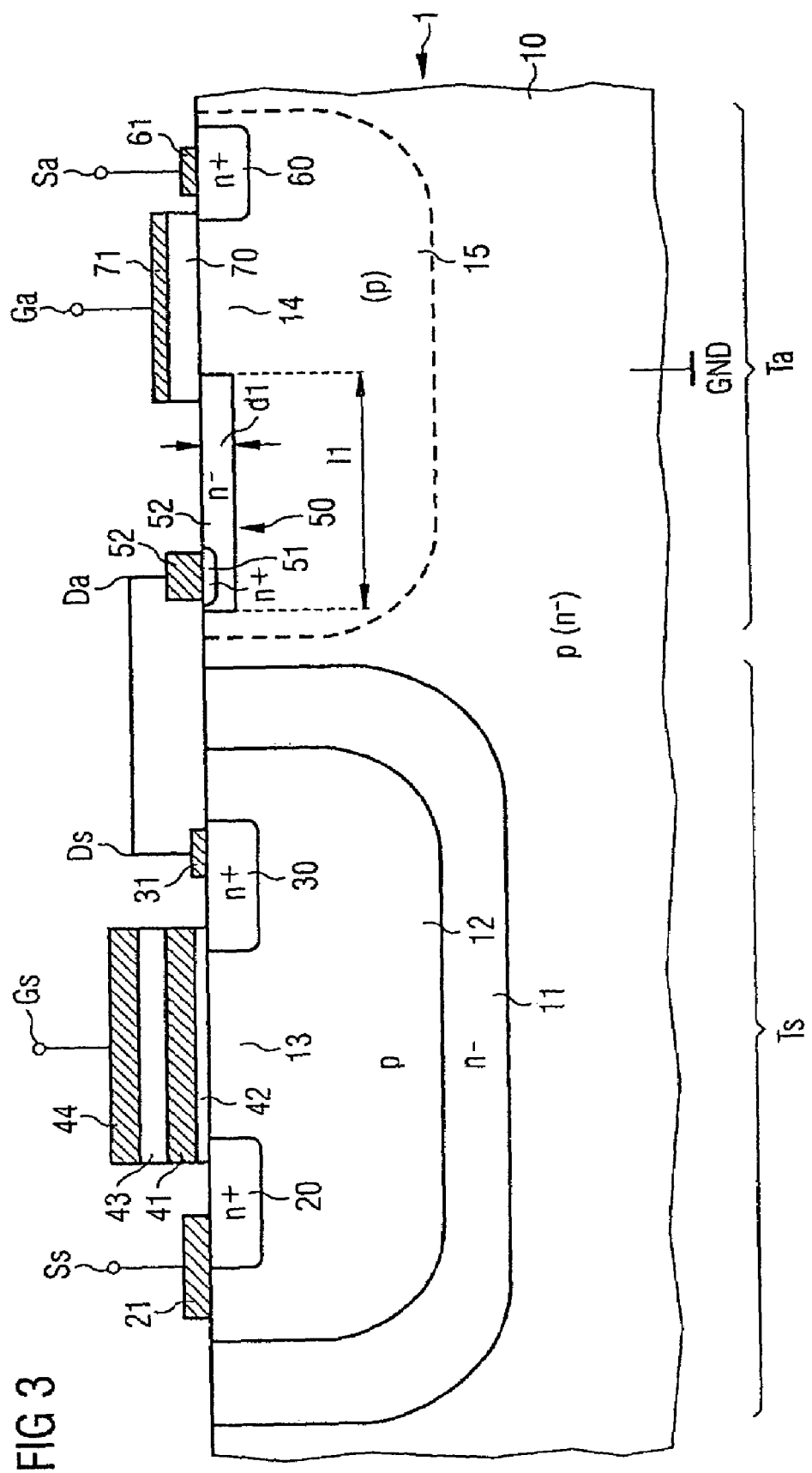
FIG. 3 illustrates an exemplary embodiment of the memory cell according to one embodiment of the invention.

FIG. 3 illustrates the construction of a memory cell according to one embodiment of the invention on the basis of a cross section through a semiconductor body 1, in which a memory transistor Ts and a selection transistor Ta of the memory cell are jointly integrated.

One embodiment of the invention is explained below using an n-conducting memory transistor and an n-conducting selection transistor. It goes without saying that both the memory transistor and the selection transistor can be realized as p-conducting transistors, in which case the semiconductor zones that are realized as p-doped zones hereinafter are then to be realized as n-doped semiconductor zones, and the semiconductor zones that are realized as n-doped zones hereinafter are then to be realized as p-doped semiconductor zones.

In one exemplary embodiment, the semiconductor body 1 has a p-doped semiconductor layer 10, which has a weakly n-doped semiconductor zone 11 in the form of a well for the purpose of realizing the memory transistor Ts. Said semiconductor zone 11 reaches as far as a surface of the semiconductor body 1 and completely surrounds a p-doped body zone 12 of the memory transistor Ts in order to insulate said p-doped body zone 12 of the memory transistor Ts from the remaining p-doped sections 10, which form the body zone of the selection transistor Ta, by means of a pn junction.

The memory transistor Ts has an n-doped first semiconductor zone 20, which is arranged in the body zone 12 and forms the source zone of said memory transistor, and a second semiconductor zone 30, which is arranged at a distance from the first semiconductor zone 20 in the lateral direction of the semiconductor body 1 and forms the drain zone of the memory transistor Ts. A section 13 of the body zone 12 that lies between the source zone 20 and the drain zone 30 forms a channel zone of the memory transistor Ts, in which channel zone an electrically conductive channel can form between the source zone and the drain zone 20, 30. The source zone 20 and the body zone 12 are short-circuited by a source electrode 21.

The memory transistor Ts furthermore has a storage electrode 41, which is arranged adjacent to the channel zone 13 and which partially overlaps the drain and source zones 30, 20 in the lateral direction in one exemplary embodiment. An insulation layer 42, which is formed over the whole area as tunnel insulation layer in the example, is arranged between said storage electrode 41 and the semiconductor zones 13, 20, 30 arranged adjacent thereto. When using silicon as semiconductor material, said tunnel insulation layer is composed for example of silicon oxide having a thickness of between 10 nm and 20 nm. Such an insulation layer can be realized in a simple manner by means of customary method steps for fabricating semiconductor components in BCD technology.

A control electrode 44 of the memory transistor Ts is arranged above the storage electrode 41 and is insulated from the storage electrode 41 by a further insulation layer 43. Said insulation layer 43 is for example a multilayer that is formed as an oxide-nitride-oxide layer and has a thickness of approximately 45 nm. In this case, this thickness of said insulation layer 43 is chosen such that no charge carriers can pass from the storage electrode 41 to the control electrode 44 even during the programming operation of the memory transistor Ts.

In one case, the selection transistor Ta has a third semiconductor zone 50, which is n-doped, and a fourth semiconductor zone 60, which is arranged at a distance from said third semiconductor zone 50 in the lateral direction and is likewise n-doped. A section of the body zone 10 between said third and fourth semiconductor zones 50, 60 forms a channel zone 14 of the selection transistor Ta, in which channel zone, given suitable driving of the selection transistor Ta, an electrically conductive channel can form between the third and fourth semiconductor zones 50, 60. Even though the third semiconductor zone 50 does not form a drain zone in the conventional sense, it is referred to hereinafter as drain zone of the selection transistor Ta, while the fourth semiconductor zone 60 is referred to as source zone of said selection transistor Ta.

In one embodiment, the selection transistor Ta furthermore has a control electrode 71, which is arranged adjacent to the channel zone 14 and partially overlaps the third and fourth semiconductor zones 50, 60 in the lateral direction in the exemplary embodiment. The control electrode 71 is insulated from the semiconductor zones 14, 50, 60 by means of a second insulation layer 70. When using silicon as semiconductor material, said second insulation layer 70 is composed for example of silicon oxide and has a thickness of between 15 nm and 20 nm in a direction perpendicular to the surface of the semiconductor body 1. In this case, the thickness of said insulation layer 70 is chosen such that no charge carriers can pass from the semiconductor body 1 to the control electrode 71 at the voltages present between the control electrode 71 and the semiconductor body during operation of the component.

The drain zone 30 of the memory transistor Ts is electrically conductively connected to the drain zone 50 of the selection transistor Ta. In order to connect an electrically conductive connection, which is illustrated only schematically in FIG. 3, between the drain zone 30 of the memory transistor Ts and the drain zone 50 of the selection transistor Ta, the source zone 50 of the selection transistor Ta has a highly doped connection zone 51. Said connection zone 51 is arranged laterally spaced apart from the channel zone 14 of the selection transistor Ta, a more weakly n-doped intermediate zone 52 being arranged between the connection zone 51 and the channel zone 14. The control electrode 71 and the second insulation layer 70 overlap the drain zone 50 in the region of said more weakly doped intermediate zone 52.

In one embodiment, the dimension of the intermediate zone 52 in the lateral direction, that is, the direction proceeding from the connection zone 51 to the channel zone 14, is $l1=2$ μm to $l1=3$ μm. In the vertical direction, the dimension of said intermediate zone 52 is in one case between $d1=0.3$ μm and $d1=1$ μm. The doping concentration of the intermediate zone is approximately $2 \cdot 10^{17}$ cm$^{-3}$ and is thus a factor of $10^2$ to $10^3$ higher than the doping concentration of the connection zone 51, which is approximately $2 \cdot 10^{19}$ cm$^{-3}$ to $2 \cdot 10^{20}$ cm$^{-3}$. The doping concentration of the body zone 10 surrounding the source zone 60 and the drain zone 50 of the selection transistor is $3 \cdot 10^{16}$ cm$^{-3}$, for example. The doping concentration of the source zone 60 corresponds for example to the doping concentration of the connection zone 51.

The body zone 10 of the selection transistor Ta is connected to a terminal for reference potential GND, which is merely illustrated schematically in FIG. 3.

The memory cell according to one embodiment of the invention is programmed by application of a programming voltage between the control electrode 44 or the control electrode connection Gs and the source electrode 21 or the source connection Ss of the memory transistor Ts. Depending on the polarity of said programming voltage, which has a magnitude of approximately 20 V, charge carriers pass from the channel zone 13 to the storage electrode 41 in order to produce a first memory state, or charge carriers pass from the storage electrode 41 through the tunnel insulation layer 42 into the channel zone 13 in order to produce a second memory state of the memory transistor Ts. From a physical standpoint, electrons tunnel in this case from the storage electrode 41 to source/bulk 20, 12. If, during the programming operation, by way of example, the source electrode 21 is connected to a high positive potential and the control electrode 44 is connected to reference potential, then all semiconductor zones within the n-doped well 11 are at this high programming potential owing to the short circuit between the source zone 20 and the body zone 12 and owing to the forward-biased pn junction between body zone 12 and the drain zone 30. Via the electrically conductive connection between the drain zone 30 of the memory transistor Ts and the connection zone 51 of the drain zone 50 of the selection transistor Ta, said high potential is also present at the connection zone 51 of the selection transistor Ta. The pn junction between the source zone 50 and the body zone 10 at reference potential GND, in particular ground, is reverse-biased in this case.

The dimensions of the intermediate zone 50 and the doping concentration thereof in comparison with the body zone 10 are chosen, in the case of the component, such that, when a voltage corresponding to the programming voltage is present between the connection zone 51 and reference potential GND, said more weakly doped intermediate zone is depleted of charge carriers in order that the high potential present at the connection zone 51 is kept away from the semiconductor zone directly below the second insulation layer 70. In this case, the semiconductor zone below the insulation layer 70 is approximately at reference potential GND, so that, during the programming of the memory cell, the control electrode 71 of the selection transistor Ta can be connected in particular to reference potential GND, as a result of which the insulation layer is not subject to any appreciable voltage loading even during the programming operation. The potential difference between the reference potential directly below the insulation layer 70 and the programming potential at the connection zone 51 is taken up completely by the semiconductor material of the intermediate layer 52 in the case of the component. The doping of said intermediate layer 52 is high enough, however, that a charge carrier transport between the channel 14 and the connection zone 51 can be effected when the selection transistor is turned on.

In the case of the component in accordance with FIG. 3, the memory transistor Ts is formed within an n-doped well 11 in a p-doped semiconductor layer 10, while the selection transistor Ta is formed directly in said layer 10. In this case, it is also possible to provide an n-doped layer, in particular a weakly n-doped layer, instead of the p-doped layer 10. The n-doped zone 11 of the memory transistor can be dispensed with in this case, so that the p-doped zone 12 is formed directly in the n-doped layer 10. In order to realize the selection transistor Ta, it is necessary in this case to provide a p-doped well 15 in the n-doped layer, which is depicted by dashes in FIG. 3. The p-doped well of the memory transistor Ts and the p-doped well of the selection transistor Ta must be isolated from one another by a section of the n-doped layer 10 in this case.

Figure 4:
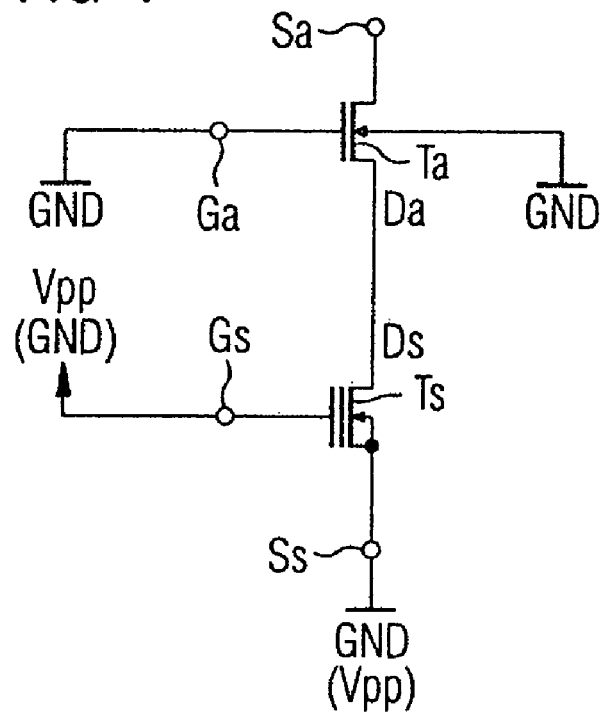
FIG. 4 illustrates the electrical equivalent circuit diagram of the memory cell according to one embodiment of the invention and illustrates the potentials at the individual connections of the memory cell during a programming operation.

FIG. 4 illustrates the electrical equivalent circuit diagram of the memory cell in accordance with FIG. 3 with the memory transistor Ts and the selection transistor Ta, the drain-source path Ds-Ss of the memory transistor Ts being connected in series with the source-drain path Sa-Da of the selection transistor Ta. FIG. 4 additionally illustrates the potential conditions during the programming of this memory cell in accordance with one embodiment. For this purpose, as already explained, the gate connection Ga of the selection transistor Ta is connected to reference potential GND, as a result of which, referring to FIG. 3, a conducting channel of the channel zone 14 is not formed below the control electrode 71. Depending on whether charge carriers are intended to be stored on the storage electrode 41 in order to bring about a first memory state of the memory transistor Ts, or whether charge carriers are intended to be removed from said storage electrode 41 in order to bring about a second memory state of said memory transistor Ts, a positive or a negative programming voltage is applied between the control electrode Gs and the source connection Ss of the memory transistor Ts. The application of a positive programming voltage is effected by applying a programming potential Vpp to the control electrode Gs and by connecting the source connection Ss to reference potential, while a negative programming voltage is effected by connecting the control electrode Gs to reference potential and the source connection Ss to programming potential Vpp.

Figure 5:
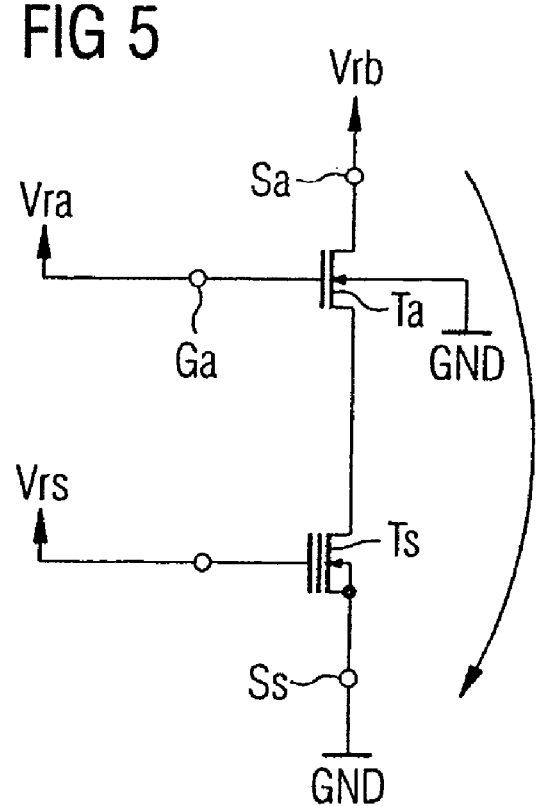
FIG. 5 illustrates the potentials at the individual connections of the memory cell during a read operation.

FIG. 5 illustrates the potential conditions at the memory cell during a read-out operation. For this purpose, a read-out potential Vra is applied to the control connection Ga of the selection transistor Ta, said read-out potential being chosen suitably in order—referring to FIG. 3—to cause a conducting channel in the channel zone 14 between the source zone 16 and the drain zone 50. A read potential Vrs is likewise applied to the memory transistor Ts. Said read potential Vrs is coordinated with the memory transistor Ts to the effect that, when said read potential Vrs is applied, the memory transistor Ts turns on if it is in the first memory state, and turns off if it is in the second memory state. In order to detect this memory state, a read-out voltage Vrb is applied between the source connection Sa of the selection transistor Ta and the source connection Ss of the memory transistor Ts, which voltage, depending on the memory state, causes a current flow via the load paths of the selection transistor Ta and of the memory transistor Ts. Not specifically illustrated in FIG. 3 is a sense circuit that detects such a current flow for evaluation of the memory state.

Figure 6:
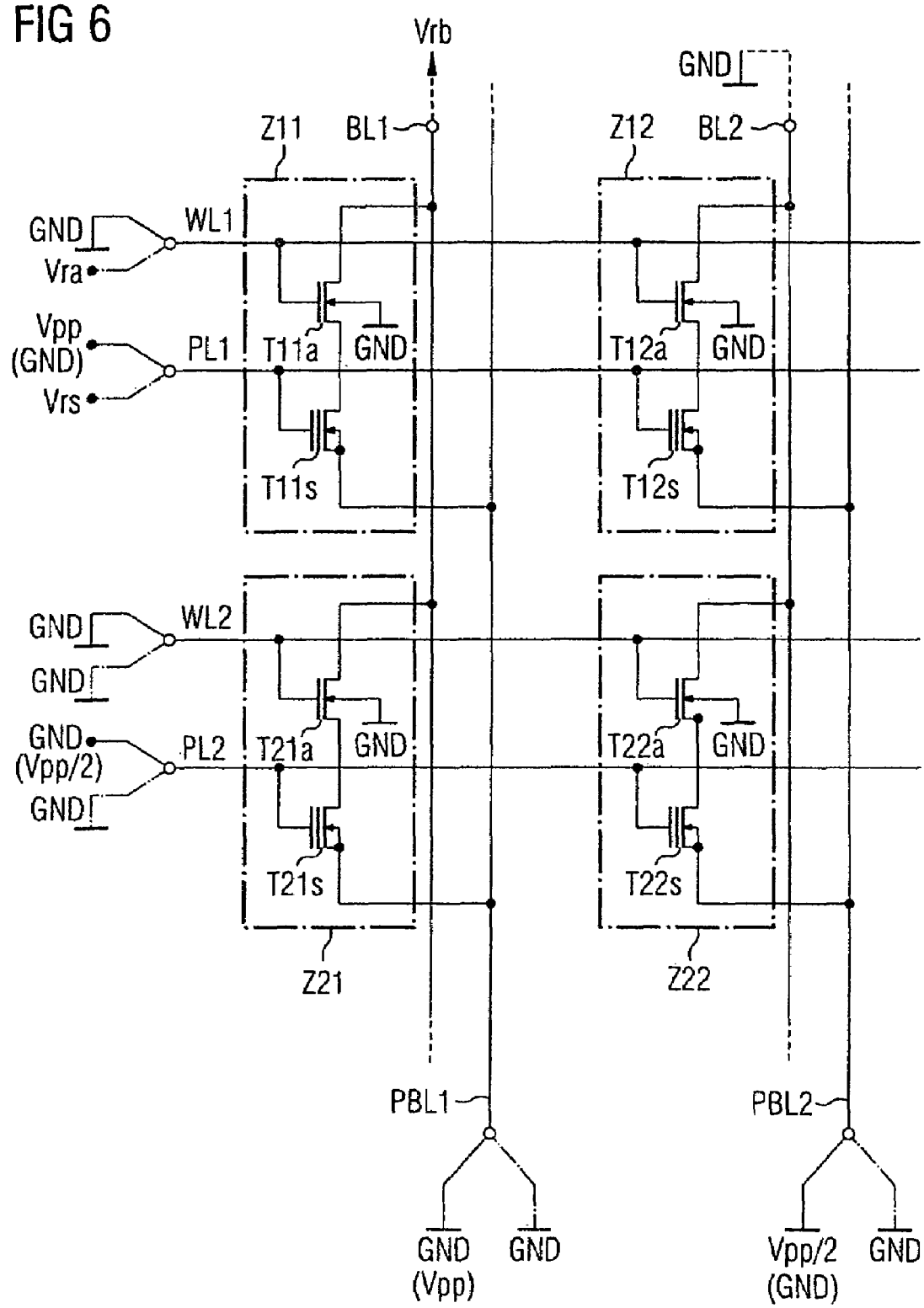
FIG. 6 illustrates a memory matrix with a plurality of memory cells according to one embodiment of the invention.

FIG. 6 illustrates a detail from a memory matrix having a plurality of memory cells according to one embodiment of the invention which are arranged in rows and in columns. FIG. 6 illustrates four such memory cells Z11, Z12, Z21, Z22, of which two are in each case arranged in a row and two are in each case arranged in a column of the memory matrix. Each of the memory cells has a selection transistor T11a, T12a, T21a, T22a and an associated memory transistor T11s, T12s, T21s, T22s. What is common to the memory cells of a row of this memory matrix is that the gate connections of the selection transistors T11a–T22a thereof are connected to a common word line WL1 or WL2, and that the gate connections of the memory transistors T11s–T22s thereof are connected to a common programming line PL1 or PL2. Each of the memory cells Z11–Z22 is furthermore assigned a bit line pair with respectively a read bit line BL1, BL2 and a programming bit line PBL1, PBL2. In this case, the read bit line BL1, BL2 is required only for reading from the respectively connected memory cells, while the programming bit line PBL1, PBL2 is required both for reading from and for programming the respectively connected memory cells.

In one case, the source connections S11a, S12a, S21a, S22a of the selection transistors T11a–T22a are in each case connected to the read bit line of the bit lines assigned to a memory cell, and, in this case, the source connections Ss11, Ss12, Ss21, Ss22 of the memory transistors T11s–T22s are in each case connected to the programming bit line PBL1, PBL2.

In one embodiment, each of the memory cells Z11–Z22 is uniquely characterized by means of the word line WL1, WL2 and the programming line PL1, PL2, and also the bit line pair BL1, PBL1, BL2, PBL2 to which the respective memory cell Z11–Z22 is connected. Via said word and programming lines WL1, PL1, WL2, PL2 and also the bit line pair BL1, PBL1, BL2, PBL2, the respective memory cell Z11–Z22 can be driven individually for programming and read-out, as is explained below on the basis of the memory cell Z11.

In one case, the gate connection G11a of the selection transistor T11a of said cell is connected to the word line WL1, which is referred to hereinafter as first word line. The gate connection G11s of the associated memory transistor T11s of said memory cell Z11 is connected to the programming line PL1, which is referred to hereinafter as first programming line. The source connection S11a of the selection transistor T11a is connected to the read bit line BL1, which is referred to hereinafter as first read bit line, and the source connection S11s of the memory transistor T11s is connected to the programming bit line PBL1, which is referred to hereinafter as first programming bit line.

For programming the first memory cell Z11, a programming voltage is applied between the first programming line PL1 and the first programming bit line PBL1. Depending on the desired sign of the programming voltage, for this purpose the first programming line PL1 is connected to a programming potential Vpp and the first programming bit line PBL1 is connected to reference potential GND, or the first programming line PL1 is connected to reference potential GND and the first programming bit line BL2 is connected to programming potential Vpp.

The potential values specified in FIG. 6 with respect to the individual word, programming and bit lines beside the solid lines represent the potentials on the individual lines during the programming operation in accordance with one embodiment. The values that are not specified in brackets specify the potential values for positive programming voltages between the first programming line PL1 and the first programming bit line PBL1, and the values specified in brackets specify the potential values for negative programming voltages.

The first word line WL1 is connected to reference potential GND during the programming operation independently of whether a positive or a negative programming voltage is applied to the memory transistor T11s. The selection transistor T11a turns off, so that the first bit line BL1 can be connected to an arbitrary potential. Said first bit line BL1 is in one case connected to reference potential GND, however.

In one embodiment, in order to prevent programming of the memory cells connected to the same word and programming lines WL1, PL1, of the second cell Z12 during the programming operation for the first cell Z11, the remaining programming bit lines, just the second programming bit line PBL2 in the example, are connected to a suitable potential. When a programming potential Vpp is applied to the first programming line PL1, a potential corresponding to half the programming voltage Vpp/2 is applied to the further programming bit lines, as a result of which only half the programming voltage is present at the memory transistor T12s of the second memory cell Z12 and this does not effect programming of the memory transistor T12s. If the first programming line PL1 is at reference potential, then reference potential GND is in one case likewise applied to the further programming bit lines PBL2.

In order to prevent programming of the memory cells connected to the same bit line pair BL1, PBL1 as the memory cell Z11 to be programmed, of the third memory cell Z21 in the exemplary embodiment illustrated, a suitable potential is applied to the further programming lines, just the second programming line PL2 in the example. If the first programming bit line PBL1 is connected to reference potential GND during the programming operation, the further programming line PL2 is likewise connected to reference potential GND, as a result of which no voltage is present at the memory transistor T12s of the third memory cell Z12. A voltage corresponding to half the programming voltage is then present at the memory cells which have neither a bit line pair nor word and programming lines in common with the memory cell Z11 to be programmed, the fourth memory cell Z22 in the example.

If the first programming bit line PBL1 is at programming potential Vpp during the programming operation, then half the programming potential Vpp/2 is applied to the further programming lines PL2, as a result of which half the programming voltage is present at the memory transistors T21s of the memory cells Z21 which have a bit line pair in common with the memory cells to be programmed.

As an alternative, it is possible, during the programming operation, independently of the sign of the programming voltage of the memory cell Z11 to be programmed, to apply half of the programming potential Vpp/2 to all the remaining programming lines PL2 and all the remaining programming bit lines PBL2. Half the programming voltage is then present at the memory transistors of the memory cells which have a bit line pair or word and programming lines in common with the memory cell to be programmed, the second and third memory cells Z12, Z21 in the example. The memory transistors of the remaining memory cells which have neither a bit line pair nor word and programming lines in common with the memory cell Z12 to be programmed, the fourth memory cell Z22 in the example, are then free of voltage.

In order to read out the memory state of the first memory cell Z11, a drive potential Vra suitable for turning on the selection transistor T11a is applied to the first word line WL1. A read potential Vrs is applied to the first programming line PL1, said read potential being chosen such that the memory transistor T11s turns on if it is in a first memory state, and turns off if it is in a second memory state. The first bit line BL1 is biased to a bit line read potential Vrb during the read operation, and the first programming bit line PBL1 is connected to reference potential GND. Depending on what memory state is present in the memory transistor T11s of the memory cell Z11 to be read, a current flows between the two bit lines BL1, PBL1, and can be detected in a manner that is not specifically illustrated.

As an alternative, it is possible to charge the bit lines BL1, PBL1 of the bit line pair to predetermined potentials in each case by means of suitable potential sources and then to subsequently insulate the bit lines from the potential sources. These potentials of the bit lines BL1, PBL1 are chosen to be different. In order to detect the memory state of the memory cell Z11, use is made in this case of the fact that the potentials of the bit lines BL1, PBL1 match one another if the memory transistor T11s turns on, and that said potentials retain their value if the memory transistor T11s turns off.

In one embodiment, the remaining word lines WL2 and the remaining programming lines PL2 and also the remaining bit lines BL2, PBL2 are connected to reference potential GND during the read-out of the first memory cell Z11.

To summarize, one embodiment of the invention relates to an electrically programmable memory cell having a memory transistor Ts having a source and a drain zone 20, 30 and also a storage electrode 41 and a control electrode 44, and a selection transistor Ta having a source and a drain zone 60, 50 and also a control electrode 71, the drain zones 30, 50 of the storage and selection transistors being electrically conductively connected to one another. In this case, the drain zone of the selection transistor Ta has a connection zone 51 and an intermediate zone doped more weakly than the connection zone, the intermediate zone 52 being arranged between the connection zone 51 and a channel zone 14 of the selection transistor and serving, during the programming operation, for taking up a programming voltage and thus for protecting a control electrode insulation layer 70 of the selection transistor Ta.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electrically programmable memory cell comprising:
a memory transistor having a first and second semiconductor zone of a first conduction type, a first body zone, which has a channel zone arranged between the first and second semiconductor zones, a storage electrode, which is isolated from the first and second semiconductor zones and the first body zone by a first insulation layer and which is formed at least in sections as tunnel insulation layer, and a first control electrode, which is arranged in a manner electrically insulated from the storage electrode;
a selection transistor having a third and fourth semiconductor zone of the first conduction type, a second body zone of a second conduction type, which has a channel zone arranged between the third and fourth semiconductor zones, and a second control electrode, which is isolated from the third and fourth semiconductor zones and the second body zone by a second insulation layer;
wherein the second semiconductor zone of the memory transistor is electrically conductively connected to the third semiconductor zone of the selection transistor;
wherein the third semiconductor zone of the selection transistor has a connection zone and an intermediate zone doped more weakly than the connection zone, the intermediate zone being arranged between the connection zone and the channel zone; and
wherein the second body zone is connected to a terminal for a reference potential.

2. The memory cell of claim 1, wherein the first semiconductor zone and the first body zone are short-circuited.

3. The memory cell of claim 2, where the first insulation layer is formed over the whole area as tunnel insulation layer.

4. The memory cell of claim 3, wherein the thickness of the first insulation layer is 10 nm to 20 nm.

5. The memory cell of claim 1, wherein the thickness of the second insulation layer is 15 nm to 25 nm.

6. The memory cell of claim 1, wherein the memory transistor and the selection transistor are integrated in a common semiconductor body, the first body zone being isolated from the second body zone by an insulation zone of the first conduction type.

7. The memory cell of claim 1, wherein the dimension of the intermediate zone proceeding from the connection zone in the direction of the channel zone is 2 µm to 3 µm.

8. The memory cell of claim 1, wherein the dimension of the intermediate zone perpendicular to the direction extending from the connection zone to the channel zone (14) is 0.3 µm to 1 µm.

9. The memory cell of claim 1, wherein a doping concentration of the intermediate zone is a factor of $10^2$ to $10^3$ less than a doping concentration of the connection zone.

10. A programmable memory cell comprising:
a memory transistor having a source zone, a drain zone, a storage electrode, and a control electrode;

a selection transistor having a source zone, a drain zone, a control electrode, and a channel zone, the drain zone further comprising a connection zone;

means for electrically isolating the storage electrode of the memory transistor;

means for electrically isolating the storage electrode of the selection transistor;

means within the drain zone of the selection transistor, arranged between the connection zone and the channel zone of the selection transistor, for taking up a programming voltage applied to the selection transistor.

11. The programmable memory cell of claim 10, further including a first insulating layer isolating the storage electrode of the memory transistor.

12. The programmable memory cell of claim 11, further including a second insulating layer isolating the storage electrode of the selection transistor.

13. The programmable memory cell of claim 11, wherein the first insulating layer is 10 nm to 20 nm in thickness.

14. The programmable memory cell of claim 13, wherein the second insulating layer is 15 nm to 25 nm.

15. The programmable memory cell of claim 10, wherein the memory and selection transistors are integrated into a single semiconductor body.

16. The programmable memory cell of claim 10, wherein the drain zone of the selection transistor further comprises an intermediate zone doped more weakly than the connection zone.

17. The programmable memory cell of claim 16, the drain zone of the memory transistor is electrically coupled to the drain zone of the selection transistor.

18. A method for programming a memory cell comprising:

providing a memory transistor having a first and a second semiconductor zone of a first conduction type, a first body zone having a channel zone between the first and second semiconductor zones, a storage electrode isolated from the first and second semiconductor zones and the first body zone, and a first control electrode;

providing a selection transistor having a third and a fourth semiconductor zone of the first conduction type, a second body zone of a second conduction type having a channel zone between the third and fourth semiconductor zones, and a second control electrode;

connecting the second semiconductor zone of the memory transistor to the third semiconductor zone of the selection transistor;

arranging an intermediate zone between a connection zone and the channel zone, and doping the intermediate zone more weakly than the connection zone.

19. The method of claim 18, further comprising:

applying a programming voltage between the first control electrode and the first semiconductor zone of the memory transistor; and connecting the second control electrode to reference potential.

20. The method of claim 19, further comprising:

applying a read voltage between the first control electrode and the first semiconductor zone of the memory transistor;

applying a read potential to the second control electrode; and applying a voltage between the first semiconductor zone and the fourth semiconductor zone.

* * * * *